(12) United States Patent
Courtney

(10) Patent No.: US 8,020,047 B2
(45) Date of Patent: Sep. 13, 2011

(54) METHOD AND APPARATUS FOR MANAGING STORAGE OF DATA

(75) Inventor: Timothy E. G. Courtney, Fareham (GB)

(73) Assignee: Xyratex Technology Limited, Havant (GB)

( * ) Notice: Subject to any disclaimer, the term of this patent is extended or adjusted under 35 U.S.C. 154(b) by 924 days.

(21) Appl. No.: 11/650,975

(22) Filed: Jan. 9, 2007

(65) Prior Publication Data

US 2007/0180337 A1    Aug. 2, 2007

Related U.S. Application Data

(60) Provisional application No. 60/759,056, filed on Jan. 17, 2006.

(51) Int. Cl.
*G06F 11/00* (2006.01)

(52) U.S. Cl. .................... 714/54; 714/6.24; 711/156

(58) Field of Classification Search .............. 714/54, 714/52, 6.24; 711/158, 160
See application file for complete search history.

(56) References Cited

U.S. PATENT DOCUMENTS

| | | | | |
|---|---|---|---|---|
| 5,761,411 A * | 6/1998 | Teague et al. | ................ | 714/47 |
| 5,923,679 A * | 7/1999 | Itoh et al. | ................ | 714/752 |
| 6,754,277 B1 * | 6/2004 | Heinzelman et al. | .... | 375/240.27 |
| 6,799,206 B1 * | 9/2004 | Workman et al. | .......... | 709/223 |
| 6,804,799 B2 * | 10/2004 | Zuraski, Jr. | .................. | 714/54 |
| 6,826,233 B1 * | 11/2004 | Oosawa | ............... | 375/240.27 |
| 6,828,967 B1 | 12/2004 | King | | |
| 6,904,540 B2 * | 6/2005 | McClellan et al. | .............. | 714/6 |
| 6,931,576 B2 * | 8/2005 | Morrison et al. | ............... | 714/54 |
| 6,965,916 B1 * | 11/2005 | Kling et al. | ................ | 709/205 |
| 7,039,837 B2 * | 5/2006 | Martini et al. | ................ | 714/52 |
| 7,523,348 B2 * | 4/2009 | Anand et al. | ................ | 714/16 |
| 2002/0019967 A1 * | 2/2002 | Bonifas | ................... | 714/786 |
| 2003/0088813 A1 * | 5/2003 | McClellan et al. | ............. | 714/42 |
| 2003/0131291 A1 * | 7/2003 | Morrison et al. | ............... | 714/54 |
| 2003/0154433 A1 * | 8/2003 | Wang et al. | ................ | 714/726 |
| 2003/0167425 A1 * | 9/2003 | Bader et al. | .................. | 714/100 |
| 2003/0229822 A1 * | 12/2003 | Kim et al. | ................ | 714/18 |
| 2005/0060618 A1 * | 3/2005 | Guha | ................ | 714/54 |
| 2005/0204792 A1 | 9/2005 | Kohnke | | |
| 2005/0240801 A1 * | 10/2005 | Johnson et al. | .................. | 714/5 |

OTHER PUBLICATIONS

Lu et al., "Issues and technologies for supporting multimedia communications over the Internet", Computer Communications, vol. 23, 2000, pp. 1323-1335.

* cited by examiner

*Primary Examiner* — Robert W Beausoliel, Jr.
*Assistant Examiner* — Elmira Mehrmanesh
(74) *Attorney, Agent, or Firm* — Pillsbury Winthrop Shaw Pittman LLP

(57) ABSTRACT

In a method and apparatus for storage of data, data is stored. The stored data is checked, for example periodically and/or on data access, for development of a fault in the stored data. If a fault is detected, at least one of: (i) increased protection and (ii) increased error correction is applied to at least some of the remaining fault-free data.

38 Claims, 1 Drawing Sheet

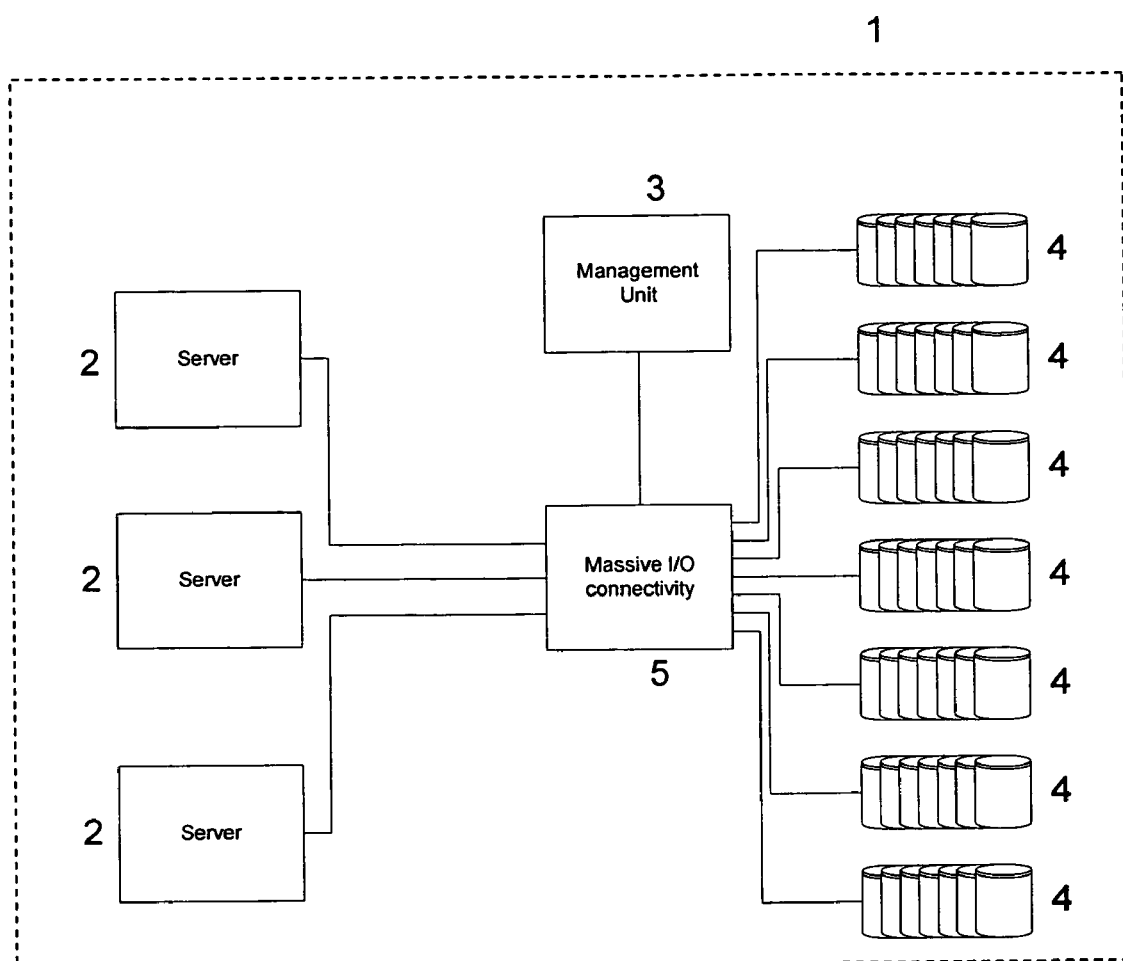

METHOD AND APPARATUS FOR MANAGING STORAGE OF DATA

This application claims the benefit of priority to U.S. application Ser. No. 60/759,056, filed Jan. 17, 2006, the content of which is hereby incorporated by reference.

The present invention relates to a method and apparatus for managing storage of data.

Historically, when data is stored, it has typically been stored with the aim of 100% persistence of the data over time. In other words, it is intended that the data be stored perfectly without any faults in or corruption of the data occurring over time. In practice, storage devices fail over time. For example, the most commonly used device for bulk storage of data is a hard disk. All hard disks inevitably fail at some point in time, for example through mechanical failure or corruption of the magnetic surface on which the data is stored.

Accordingly, historically, data has been classed as being one of two types. For the first type, it is determined that it is not important if the data is lost such that no particular protection or error correction (beyond that typically applied by the data storage devices themselves) is applied to the data. For the other type of data, it is determined that the data must not be lost. In that case, protection can be applied to the data. A well known and effective type of protection is provided by the various types of RAID (Redundant Array of Inexpensive Disks). Protection of data, using for example RAID, is inevitably relatively expensive. This is becoming a growing problem given that increasing amounts of data is stored electronically, not only because of the increasing use of computers but also because file sizes are increasing. Particular examples include audio and visual files, including static and video images, for which the data files are increasing in size owing to customer expectations of improved sound quality and higher resolution of the images. Much data is currently being archived with the requirement that it persist for very long periods of time, such as one hundred years or more. The cost of providing adequate protection for that data over such a period is growing and is likely to become prohibitive on a practical basis.

U.S. Pat. No. 6,828,967 discloses a system that is intended to deal with the problem of the cost of providing access to stored image data. In particular, a relatively low resolution version of the image data is stored on-line in order to be accessible relatively quickly. Data relating to higher resolution versions of the images is stored off-line, and therefore more cheaply but less readily accessible. Nevertheless, in the system of U.S. Pat. No. 6,828,967, it is still practically assumed that the stored data will persist perfectly for all time.

According to a first aspect of the present invention, there is provided a method of managing storage of data, the method comprising: storing data; checking the stored data for development of a fault in the stored data; and, if a fault is detected, applying to at least some of the remaining fault-free data at least one of: (i) increased protection and (ii) increased error correction.

The present invention is predicated on the realisation that not all data has to be stored perfectly over extended periods of time or in perpetuity. In particular, for many types of data, some of the stored data can be lost and yet the remaining fault-free data can be used as a usable data set. It will be appreciated that this is a separation of the interpretation of the data and the data itself. The data set is preserved such that the interpretation remains the same, or at least similar or "the same" within pre-defined bounds, even though some of the data is or may be lost. The preferred embodiments of the present invention do not (necessarily) provide for 100% persistence of the data in perpetuity but instead provide for a known and acceptable degradation over time, with measures being taken as necessary to protect remaining data to ensure that a useable data set remains. This can be referred to as "graceful degradation" of the stored data. A number of examples are discussed below. A particular example is stored image data. For example, if the data representing only a few of the pixels is lost, then the viewer is unlikely to notice the loss at all. If the loss is greater, for example if many pixels or a whole row of pixels or even a whole frame of a video image is lost, then interpolation can be used to allow the image or sequence of images to be presented to a viewer with little or no loss of perceptible quality of the image, the interpretation of the data remaining constant. This ability to mask a loss of data characterises graceful degradation of the data, and can be contrasted with prior art techniques that try to prevent any data being lost at all (e.g. by using RAID techniques or similar) or that try to recover lost data after a loss (e.g. from back-up storage of the original data). This masking of loss will typically be coupled with techniques to prevent further data loss and so maintain a usable data set after the original loss.

The checking of the stored data for development of a fault in the stored data may be carried out periodically or in reaction to attempted data access. The checking may be at regular intervals of any appropriate time period, which will depend on the nature of the data and its expected storage lifetime. Thus, the data could be checked every second, every hour, every day, once a month or even once a year, depending on the nature of the data and its importance in providing a usable data set and the nature of the storage of the data. The frequency of checking may be varied over time. For example, if it is found that a fault has developed, the checking interval may be reduced in order to minimise the chance of further faults developing that would cause the data as a whole to be unusable.

In an embodiment, said data is stored in at least one data storage device, said at least one of (i) increased protection and (ii) increased error correction being applied to at least some of the data that is physically adjacent the faulty data in said at least one data storage device.

In an embodiment, said at least one of (i) increased protection and (ii) increased error correction is applied to at least some of the data that is adjacent the faulty data in a file that is made up of said data. For example, if the data is image data and it is found that data relating to a certain pixel, or row of pixels, or frame of a moving image, is faulty, then increased protection and/or error correction can be applied around neighbouring pixels, rows of pixels, or frames, respectively. These neighbouring pixels or rows may be logical neighbours in time as well as physically within a single image frame. This maximises the possibility of the remaining fault-free data being usable over an extended period to reconstruct the image, either as a slightly degraded version or through interpolation.

In an embodiment, the method comprises classifying the data according to its importance in providing a usable data set, and storing the data according to the importance of the data. It is a fact that some data is more important than other data. Many examples of this exist, as will be discussed further below. In this embodiment, increased protection and/or error correction, for example, can be applied to the more important data, with lesser or no protection and/or error correction being applied to the less important data.

In an embodiment, the method comprises, after a fault has been detected, analysing the remaining fault-free data and reassessing its classification according to its importance in providing a usable data set from the remaining fault-free data, and storing the remaining fault-free data according to the importance of the remaining fault-free data. In this embodiment, once some data has become faulty, the importance of the remaining fault-free data will typically change and it will typically become more important to preserve the remaining fault-free data to allow a usable data set to be maintained. For example, once a fault in data has been detected, error prevention and/or correction can be applied to the remaining fault-free data on an increasing scale according to the proximity of the fault-free data to the faulty data, such that increasing levels of error prevention and/or correction are applied as the fault-free data is closer to the faulty data. Here, "proximity" may be in the sense of proximate on the storage device or proximate in the image or other file that is constructed from the data.

In an embodiment, data that is classed as being of relatively low importance is stored with a relatively low level of protection or no protection, and data that is classed as being of relatively high importance is stored with a relatively high level of protection.

In an embodiment, data that is classed as being of relatively low importance is stored with a relatively low level of error correction or no error correction, and data that is classed as being of relatively high importance is stored with a relatively high level of error correction.

In an embodiment, the data is stored in at least one storage device, the method comprising, when a fault in the data stored in said at least one storage device is detected, said data storage device returning information about why the fault in the data occurred. This allows the data storage manager to make a better informed decision as to how to protect the remaining fault-free data.

In an embodiment, the data is stored in at least one storage device, the method comprising, when a fault in the data stored in said at least one storage device is detected, determining the likelihood of said at least one data storage device suffering complete failure within a certain time period and moving the data from said at least one data storage device to another data storage device if said likelihood exceeds a threshold. For example, if a hard disk reports repeated checksum errors, as an example 10 out of the past 100 accesses reporting such a failure, whilst not failing completely, the device may be considered as being in the process of failing and the data moved.

In an embodiment, the method comprises sending a prompt to a user to check that the remaining fault-free data provides a useable data set.

According to a second aspect of the present invention, there is provided a method of managing storage of data, the method comprising: storing data in at least one storage device; monitoring the at least one storage device to determine whether the at least one storage device has failed or is likely to fail within a certain time period; and, if it is determined that the at least one storage device has failed or is likely to fail within a certain time period, changing the manner in which the data is stored in accordance with at least one property of the data.

The monitoring may effectively be pro-active or reactive.

In an embodiment, the at least one property of the data is the importance of the data in providing a usable data set.

In an embodiment, the manner in which the data is stored is changed by increasing protection that is applied to at least some of the stored data.

In an embodiment, the manner in which the data is stored is changed by increasing error protection that is applied to at least some of the stored data.

According to a third aspect of the present invention, there is provided apparatus for managing storage of data, the apparatus comprising: a data storage manager arranged to check the stored data for development of a fault in the stored data, and, if a fault is detected, to cause application to at least some of the remaining fault-free data at least one of: (i) increased protection and (ii) increased error correction.

In an embodiment, the data storage manager is arranged to check the stored data periodically and/or on data access for development of a fault in the stored data.

In an embodiment, said data is stored in at least one data storage device, and wherein the data storage manager is arranged to cause said at least one of (i) increased protection and (ii) increased error correction to be applied to at least some of the data that is physically adjacent the faulty data in said at least one data storage device.

In an embodiment, the data storage manager is arranged to cause said at least one of (i) increased protection and (ii) increased error correction to be applied to at least some of the data that is adjacent the faulty data in a file that is made up of said data.

In an embodiment, the data storage manager is arranged to cause said at least one of (i) increased protection and (ii) increased error correction to be applied to at least some of the data that is logically temporally adjacent the faulty data in a data stream that is made up of said data.

In an embodiment, the apparatus comprises a classifier arranged to classify the data according to its importance in providing a usable data set, the data storage manager being arranged to cause the data to be stored according to the importance of the data. In an embodiment, the classifier is arranged to reclassify at least some of the remaining fault-free data according to its importance in providing a usable data set from the remaining fault-free data after a fault has been detected, the data storage manager being arranged to cause the remaining fault-free data to be stored according to the importance of the remaining fault-free data.

In an embodiment, the data storage manager is arranged so that data that is classed as being of relatively low importance is stored with a relatively low level of protection or no protection, and data that is classed as being of relatively high importance is stored with a relatively high level of protection.

In an embodiment, the data storage manager is arranged so that data that is classed as being of relatively low importance is stored with a relatively low level of error correction or no error correction, and data that is classed as being of relatively high importance is stored with a relatively high level of error correction.

In an embodiment, the data is stored in at least one storage device, the data storage device being arranged so that, when a fault in the data stored in said at least one storage device is detected, said data storage device returns information about why the fault in the data occurred.

In an embodiment, the data is stored in at least one storage device, the data storage device being arranged so that, when a fault in the data stored in said at least one storage device is detected, the likelihood of said at least one data storage device suffering complete failure within a certain time period is determined and so that the data is moved from said at least one data storage device to another data storage device if said likelihood exceeds a threshold.

In an embodiment, the data storage manager is arranged so that a prompt is sent to a user to check that the remaining fault-free data provides a useable data set.

According to a fourth aspect of the present invention, there is provided apparatus for managing storage of data, the apparatus comprising: at least one storage device in which data can be stored; and, a data storage manager arranged to monitor the at least one storage device to determine whether the at least one storage device has failed or is likely to fail within a certain time period, and, if it is determined that the at least one storage device has failed or is likely to fail within a certain time period, to cause the manner in which the data is stored to be changed in accordance with at least one property of the data.

In an embodiment, the at least one property of the data is the importance of the data in providing a usable data set.

In an embodiment, the data storage manager is arranged so that the manner in which the data is stored is changed by increasing protection that is applied to at least some of the stored data.

In an embodiment, the data storage manager is arranged so that the manner in which the data is stored is changed by increasing error protection that is applied to at least some of the stored data.

BRIEF DESCRIPTION OF THE DRAWINGS

FIG. 1 shows schematically an example of apparatus 1 according to an embodiment of the present invention.

Embodiments of the present invention will now be described by way of example with reference to the accompanying drawing in which FIG. 1 shows schematically an example of apparatus according to an embodiment of the present invention.

There are many examples of data that can be stored in a manner such that faults in the data can arise or parts of the data may be lost over time and yet the remaining fault-free data is usable. Without limitation, a particular example is the saving of audio-visual data in archives or the like. If for example the data representing a video image is stored and only data relating to a few pixels is lost over time, then the viewer is unlikely to notice any loss of quality in the image. If a greater number of pixels is lost, or if for example a whole row of pixels or even a whole frame of a video sequence is lost, then known interpolation techniques can be used to mask the loss when the image is reconstructed from the data. This ability to mask failure rather than attempting to recover from failure can be termed "graceful degradation". In another example from a different field altogether, many retailers currently provide so-called loyalty cards to customers, which effectively provide the customer with discounts on purchases or refunds. The retailers use the loyalty cards to track the customer purchases over time, typically with a view to providing the customer with focused and appropriate marketing material. If some of the data is lost, for example one month's data out of the last twelve months, then the remaining data set is still usable and useful. In such a case, therefore, it is not in fact necessary to maintain the data perfectly over time. Instead, it is simply necessary to ensure that the interpretation of the remaining data set does not differ (at least significantly) from the interpretation of the original data set.

Many other examples exist for which it is not necessary to maintain the data perfectly and therefore for which some data loss over time is acceptable. For this type of data, the significant expense of providing 100% protection of the data, for example using RAID technology, is not necessary and is therefore a cost that in principle can be avoided. Nevertheless, for this type of data, if the data loss over time continues, the remaining fault-free data becomes less and less useful until a point is reached where the remaining fault-free data cannot be used to provide useful information (for example to form a video image of sufficient quality, or to provide a sufficiently accurate basis for marketing in the examples mentioned above).

A particular aim of the preferred embodiments is therefore to permit data to be stored relatively inexpensively, for example by avoiding having to apply protection, such as RAID, to the entire data set, and to manage loss of any data over time so that the remaining fault-free data is usable.

The preferred embodiments provide for graceful degradation of stored data using a number of techniques, which in general can be used individually or in combination. Examples will be discussed below.

When data is stored in accordance with the preferred embodiments, parameters are set that describe the manner in which the data can be permitted to fail and the likely required lifetime of the data. It should be noted that in principle the lifetime could be infinite, though this is not preferred. These parameters determine how the data is stored and what error correction and protection mechanisms should be used. A data storage manager, which may be implemented in software or hardware or a combination, then manages the data to ensure that the data is checked so that it can be preserved in an acceptable manner in accordance with the set parameters. Typically, the data storage manager checks the data for corruption on data access and/or on a periodic basis. For example, depending on the nature of the data and the parameters, the data might be checked every second, every minute, every hour, once a day, once a month, etc., at least if the data has not been accessed in the meantime. If a fault in the data is detected, measures can then be taken in order to better preserve the remaining fault-free data.

For example, if a fault in the stored data is detected by the data storage manager, the data storage manager can cause at least some of the remaining fault-free data to be subject to increased protection. By way of example, the data might initially be stored without any protection (for example of the RAID type or the like), which keeps down costs. If a fault in the data is detected, or if a sufficient number of faults is detected, such that the data storage manager determines that measures need to be taken, then the data storage manager can cause protection to be provided to at least some of the remaining data. In the example of the storage of data relating to images, if for example data relating to a row of pixels is lost, then protection can be provided for the data of at least one of the adjacent rows of pixels. In this way, the data relating to that adjacent row of pixels will be preserved, in principle for any period of time, which allows spatial resolution interpolation techniques to be successfully used to recover an adequate version of the original image despite the fact that a row of pixels has been lost. Similarly, if for example a frame of image data in a data stream is lost, protection can be provided to the data relating to adjacent frames in the video sequence, which permits time resolution interpolation techniques to be used on those protected frames to construct an adequate video image from the remaining fault-free data.

In another example, if a certain level of protection has already been provided to some of the data, then when a fault in the data is detected, an increased level of protection can be provided to at least some of the remaining fault-free data. For example, initially RAID 5 protection might initially be provided, and this can be increased to RAID 6 protection on detection of a fault.

In another example, the protection can be provided on a sliding scale that depends on the importance of the data. To illustrate this, in the example of loss of frame of a video sequence, a high level of protection, such as RAID 6, can be applied by the data storage manager to the one or two frames on either side of a corrupted frame, with a lower level of protection, such as RAID 5, being provided to the next several frames, such as frames 3 to 20, on either side of the corrupted frame, and so on.

In this manner, a high level of protection is applied to the most critical data, i.e. in this example the data that in some sense is immediately adjacent corrupted data, with a lower and therefore less expensive level of protection being provided to data that is in some sense more distant and therefore less critical.

Another technique for managing the stored data is to apply increased error correction to remaining fault-free data. As is known, storage devices such as hard disks and the like typically already use error correction codes on blocks of data as they are read from the storage device. In one embodiment of the present invention, to maximise storage space on the storage devices and therefore to keep down the basic cost of storage, it might be determined that no error correction is initially required on the blocks of data or indeed at the disk level at all. If a fault arises in the data as detected by the data storage manager, the data storage manager can cause error correction to be applied to at least some of the remaining fault-free data. As in the example of applying protection to the remaining fault-free data, (increased) error correction is preferentially applied to the data that is in some sense adjacent the faulty data so as to maximise the likelihood that the remaining data remains useful over an extended period of time.

Moreover, the error correction techniques that are applied may be different according to the nature of the data, so that the error correction is tailored so as to keep down costs whilst providing adequate error correction. For example, for audio data, it is preferable to use a system that provides good burst error correction but for which a relatively low level of bit error correction can be applied.

It is also preferred that the data storage manager can determine the likelihood that there is an uncorrected error in the data. For example, a likelihood prediction can be made based on previous data to determine the likelihood that a particular bit is erroneous.

In order to facilitate implementation of the preferred embodiments, the data storage device or devices on which the data is stored may return what data it knows to be valid from a block that has suffered corruption, together with an indicator of how failed the data might be. This information is useful to the data storage manager because, as already explained above, even though there may be faulty data, the remaining fault-free data can be usable. Thus, even at the sub-block level, there may be data in a failed block that is nevertheless useful depending on the nature of the data and the extent to which it has become corrupted.

In order to facilitate further the implementation of the preferred embodiments, object-based storage systems may be used to store the data on the one or more storage devices. In contrast to the more conventional storage of data as fixed blocks, object-based storage facilitates the ordering of the stored data, which is particularly helpful in the present context.

Furthermore, if it is found that a fault in data has occurred, for example in a particular block of stored data, a flag or some other prompt can be generated so that a human user can be prompted to check that the remaining data is useful. This might arise when for example the stored data is accessed by a user. For example, if a user is attempting to access data relating to a stored image and it is found that a block of the data is corrupt, the block of data might be returned in any event (because it can be useful in reconstructing the image) but the user is also specifically prompted to check that the image is of a useful quality. Depending on the response provided by the user, the data storage manager can take steps to increase the protection or error correction applied to the remaining fault-free data.

Because the preferred embodiments typically allow data to degrade over time, the cost of storage of the data can be reduced further by using storage devices that would otherwise not be useful. For example, during manufacture of storage devices such as hard disks and the like, the devices are subject to quality control during which the devices are checked inter alia for their ability to store data to a certain specification. In any batch of hard disks and the like, some will normally be discarded by the manufacturer because for example the surface of the disk is partially damaged such that the manufacturer cannot certify the hard disk as providing a normally adequate storage of data over time. Because the preferred embodiments permit data to be lost over time, albeit in a managed way, these otherwise "failed" disks can be used to store data that is permitted to degrade over time. If errors in the stored data are detected over time, this is not generally a particular concern because of the measures taken by the preferred embodiments to preserve the remaining fault-free data.

FIG. 1 shows schematically an example of apparatus 1 according to an embodiment of the present invention. Plural servers 2 are provided, which may be standard storage servers that run additional software to provide interaction with a data storage manager 3 and to provide the additional functionality required to store data in the manner requested by data storage manager 3. For example, in the case of audio data, this may be in regularly sized chunks, split by frequency range, split by instrument type, or any other characteristic way. In another example, for video data, it may be by frame, or by row of pixels, or any other characteristic way.

Also shown in FIG. 1 are storage sub-systems 4 that are capable of implementing a level of error correction or data protection as required by the data storage manager 3. These storage sub-systems 4 consist of one or more storage devices and zero or more low level storage controllers (not shown) operating to implement one or more protection and/or correction techniques. The full system for the examples described below will contain two or more storage sub-systems 4 although this need not be the case with alternative valid management approaches.

The data storage manager 3, the server(s) 2 and the storage sub-system(s) 4 are all interconnected via a suitable network 5 or similar, which may include one or more of system level interconnect, a LAN, a WAN, and the internet.

The data storage manager 3 may be a processor (either general purpose or application specific) running software to enable it to "exercise" data and to respond to server enquiries as to how given data files should be broken up for storage. The data storage manager 3 maintains a map of the attached storage sub-system(s) 4 along with a map of the used and unused potions of the attached storage sub-system(s) 4. Along with details of the attached storage sub-system(s) 4 are details of the protection and correction mechanisms that can be used in conjunction with the attached storage sub-system(s) 4 and in conjunction with the servers 2. This can include protection and correction mechanisms that a server 2 can implement, the storage that is provided by the storage sub-system(s) 4 being used simply as a data store, and those that are native to the storage sub-system(s) 4.

To illustrate further some specific examples, consider first a sequence of images that combine to give a video stream. When a user directs a server 2 to store this data, the video data is accompanied by data that is input by the user and that gives information about the level of data persistence required and the importance of the data. For example a user may say that frame level reconstruction techniques are acceptable for 1 frame in 24 but that the start and end six frames must remain for these techniques to be applied. Similarly the user may specify that pixel failure correction techniques may be applied from the corresponding pixels in preceding frames or from the neighbouring pixels within a frame. Such rules may be specified by a user or automatically applied by the controller based on the data type in question. The user also provides to the server 2 (and so to the data storage manager 3) details of the data type and content through meta-data to be stored in the system. The rule set used to determine the importance of data may be derived directly from the data type by the storage manager instead of directly by the user. The server 2 communicates initially with the data storage manager 3 to determine the storage mechanisms that are appropriate for this data. As an example, the data storage manager 3 directs the server 2 to store consecutive images on different storage sub-systems 4, possibly in a rotating manner using the error correction and protection levels required by the user. In the example given, the first and last six frames may be designated as stored using RAID level 5 encoding whilst the remaining frames are stored un-encoded over an array of 24 sub-systems. Once the images are stored, the server 2 notifies the data storage manager 3 through the network 5 that the data has been stored and the locations in the storage sub-systems 4 of the images.

During its run time the data storage manager 3 exercises this data periodically, either in response to user request or at a given minimum exercise rate set either by the user or by the storage manager based on the data type. This exercising will involve the data storage manager 3 requesting that the storage sub-system 4 returns the data to the data storage manager 3. The storage sub-systems 4 will either return data they believe to be correct or they will return an error code. This code will give the data storage manager 3 information concerning the nature of a failure, for example the fact that there is a failed disk in the sub-system or that a checksum revealed a data error. If the data storage manager 3 gets data from the storage sub-system 4, it is able to perform basic analysis on it to confirm that it still conforms to the characteristics described in the meta-data provided when the data was originally stored.

In a particular example, the original storage mechanism used no error correction or data protection scheme when the data was stored, in order to maximise the usable volume of the system. If, upon exercising the data, the data storage manager 3 obtains erroneous or no data from one of the sub-systems 4, it is then able to add error correction to the still-usable data from the other sub-systems 4 and save it back to these sub-systems 4, at the same time directing the sub-systems 4 to use a higher level of data protection (e.g. RAID 5). This then reduces the likelihood of the remaining data becoming unusable. With this approach and n sub-systems, it is likely that only 1/nth of the data will become non-valid during the lifetime of the data.

By using this sort of system, maximum utilisation of non-failed storage sub-systems 4 may be achieved whilst maintaining sufficient data for the user to consider the remaining data set useful.

In another example, where for example the data in question is customer loyalty card or similar time-related data, the data storage manager 3 instructs the server 2 to add new months of data to different storage sub-systems 4 than the previous months' data. Once this is accomplished, the system is able to operate in a similar manner to ensure that the maximum usage of the storage sub-systems is obtained and that there will be at most 1/nth data loss. In this example, the data storage manager is able to measure the importance of a given month's data through analysis of the trends illustrated by the currently existing fault-free data set and the change in both the trends and the statistical confidence in those trends if a given month's data is lost. In this way, the storage manager is able to direct that data that has high importance to the interpretation of the full set is stored with high protection, for example RAID level 6, and that data with low importance is stored with low, or no, protection.

In either of these examples, it is expected that the data storage manager 3 will also interrogate the storage sub-systems 4 to request functional checks as well as data requests. The storage sub-systems 4 will then perform self-check operations (such as actuator response times, surface scans, etc.) to determine whether there is a localised failure or whether there is likely to be a localised failure soon. In the event of a failure being detected, the data storage manager 3 then instructs the storage sub-systems 4 to increase the protection and correction levels applied to the remaining data (which may be both within and without an individual sub-system 4). In the event of a failure being predicted, the data storage manager 3 both increases the protection and/or correction level applied to the data and sends the server 2 a message for the user to inform the user of the increased likelihood of hardware failure. The user is then free to act in a way to mitigate against this predicted failure.

It is further expected that the user will maintain a preventative approach to the maintenance of the storage sub-systems 4. This includes but is not limited to replacing individual storage devices prior to their failure in accordance with a predicted average lifetime calculation.

In the description above, mention has been made of "a data storage manager". This may be implemented in software or hardware (such as ASICs) or a combination. The data storage manager may be a single entity. Alternatively, the function of the data storage manager may be spread over a number of discrete devices, including for example the data storage devices on which the data is stored, network controllers that control flow of data between for example a user and the data storage devices, etc. The data storage manager, whether a single entity or spread over plural devices, manages the stored data through knowledge about the data, including the type of data (e.g. image files, audio files, customer trend data, and other data for which perfect storage over time is not required), the expected storage lifetime of the data (typically as determined by a human user), the "criticality" or "importance" of the data (typically determined by a human user), down to details such as the pixel size in bits for an image, the frame size and the frame rate. One such approach for determining the criticality of data is to determine the ability of the system to meet the user criteria for data degradation level in the event that a given data portion becomes non valid. If the criteria are still met, then the data storage manager will not change the importance setting for that data. If the criteria become breached, then the criticality level will be increased.

Embodiments of the present invention have been described. However, it will be appreciated that variations and modifications may be made to the examples described within the scope of the present invention.

The invention claimed is:
1. A method of managing storage of data comprising at least one data set, the method comprising:
 classifying data within a data set according to its importance in rendering the data set usable;
 storing the data according to the importance of the data in the data set;

checking the stored data for development of a fault in the stored data; and, wherein, after a fault is detected in a data set, the data set comprises faulty data and fault-free data and the method further comprises:

analysing at least some of the remaining fault-free data in the data set and reassessing its classification according to its importance in providing a usable data set from the fault-free data alone; and applying, in dependence upon the classification of the remaining fault-free data in the data set, to at least some of the remaining fault-free data in the data set at least one of: (i) increased protection and (ii) increased error correction.

2. A method according to claim 1, wherein the checking of the stored data for development of a fault in the stored data is carried out periodically.

3. A method according to claim 1, wherein the checking of the stored data for development of a fault in the stored data is carried out as the stored data is accessed.

4. A method according to claim 3, wherein the checking of the stored data for development of a fault in the stored data is additionally carried out periodically if the stored data has not been accessed for a certain period of time.

5. A method according to claim 1, wherein said data is stored in at least one data storage device, said at least one of (i) increased protection and (ii) increased error correction being applied to at least some of the data that is physically adjacent the faulty data in said at least one data storage device.

6. A method according to claim 1, wherein said at least one of (i) increased protection and (ii) increased error correction is applied to at least some of the data that is adjacent the faulty data in a file that is made up of said data.

7. A method according to claim 1, wherein said at least one of (i) increased protection and (ii) increased error correction is applied to at least some of the data that is logically temporally adjacent the faulty data in a data stream that is made up of said data.

8. A method according to claim 1, wherein data that is classed as being of relatively low importance is stored with a relatively low level of protection or no protection, and data that is classed as being of relatively high importance is stored with a relatively high level of protection.

9. A method according to claim 1, wherein data that is classed as being of relatively low importance is stored with a relatively low level of error correction or no error correction, and data that is classed as being of relatively high importance is stored with a relatively high level of error correction.

10. A method according to claim 1, wherein the data is stored in at least one storage device, and comprising, when a fault in the data stored in said at least one storage device is detected, said data storage device returning information about why the fault in the data occurred.

11. A method according to claim 1, wherein the data is stored in at least one storage device, and comprising, when a fault in the data stored in said at least one storage device is detected, determining the likelihood of said at least one data storage device suffering complete failure within a certain time period and moving the data from said at least one data storage device to another data storage device if said likelihood exceeds a threshold.

12. A method according to claim 1, comprising sending a prompt to a user to check that the remaining fault-free data provides a useable data set.

13. A method according to claim 1, wherein the faulty stored data is lost and not recovered.

14. A method of managing storage of data comprising at least one data set, the method comprising:

classifying data within a data set according to its importance in rendering the data set usable;

storing data in at least one storage device;

monitoring the at least one storage device to determine whether the at least one storage device has failed or is likely to fail within a certain time period; and, if it is determined that the at least one storage device has failed or is likely to fail within a certain time period such that data in a data set has become faulty or is likely to become faulty, analysing at least some of the remaining fault-free data in the data set and reassessing its classification according to its importance in rendering the data set usable from the fault-free data alone; and, maintaining or changing the manner in which the data is stored dependent upon the classification of the data in the data set in providing a usable data set.

15. A method according to claim 14, wherein the manner in which the data is stored is changed by increasing protection that is applied to at least some of the stored data.

16. A method according to claim 14, wherein the manner in which the data is stored is changed by increasing error protection that is applied to at least some of the stored data.

17. Apparatus for managing storage of data comprising at least one data set, the apparatus comprising:

a classifier arranged to classify data within a data set according to its importance in rendering the data set usable; and a data storage manager arranged to store the data according to the importance of the data in the data set and to check the stored data for development of a fault in the stored data, wherein, after a fault is detected in a data set, the data set comprises faulty data and fault-free data and, the data storage manager being further arranged;

to analyse at least some of the remaining fault-free data in the data set and reassess its classification according to its importance in providing a usable data set from the fault-free data alone and to cause, in dependence upon the classification of the remaining fault-free data in the data set, application to at least some of the remaining fault-free data in the data set at least one of: (i) increased protection and (ii) increased error correction.

18. Apparatus according to claim 17, wherein the data storage manager is arranged to check the stored data periodically for development of a fault in the stored data.

19. Apparatus according to claim 17, wherein the data storage manager is arranged to check the stored data as the stored data is accessed.

20. Apparatus according to claim 19, wherein the data storage manager is arranged additionally to check the stored data periodically if the stored data has not been accessed for a certain period of time.

21. Apparatus according to claim 17, wherein said data is stored in at least one data storage device, and wherein the data storage manager is arranged to cause said at least one of (i) increased protection and (ii) increased error correction to be applied to at least some of the data that is physically adjacent the faulty data in said at least one data storage device.

22. Apparatus according to claim 17, wherein the data storage manager is arranged to cause said at least one of (i) increased protection and (ii) increased error correction to be applied to at least some of the data that is adjacent the faulty data in a file that is made up of said data.

23. Apparatus according to claim 17, wherein the data storage manager is arranged to cause said at least one of (i) increased protection and (ii) increased error correction to be applied to at least some of the data that is logically temporally adjacent the faulty data in a data stream that is made up of said data.

24. Apparatus according to claim 17, wherein the data storage manager is arranged so that data that is classed as being of relatively low importance is stored with a relatively low level of protection or no protection, and data that is classed as being of relatively high importance is stored with a relatively high level of protection.

25. Apparatus according to claim 17, wherein the data storage manager is arranged so that data that is classed as being of relatively low importance is stored with a relatively low level of error correction or no error correction, and data that is classed as being of relatively high importance is stored with a relatively high level of error correction.

26. Apparatus according to claim 17, wherein the data is stored in at least one storage device, the data storage device being arranged so that; when a fault in the data stored in said at least one storage device is detected, said data storage device returns information about why the fault in the data occurred.

27. Apparatus according to claim 17, wherein the data is stored in at least one storage device, the data storage device being arranged so that, when a fault in the data stored in said at least one storage device is detected, the likelihood of said at least one data storage device suffering complete failure within a certain time period is determined and so that the data is moved from said at least one data storage device to another data storage device if said likelihood exceeds a threshold.

28. Apparatus according to claim 17, wherein the data storage manager is arranged so that a prompt is sent to a user to check that the remaining fault-free data provides a useable data set.

29. Apparatus according to claim 17, wherein the faulty stored data is lost and not recovered.

30. Apparatus for managing storage of data comprising at least one data set, the apparatus comprising:
   a classifier arranged to classify data within a data set according to its importance in rendering the data set usable;
   at least one storage device in which data can be stored according to the importance of the data in the data set; and,
   a data storage manager arranged to monitor the at least one storage device to determine whether the at least one storage device has failed or is likely to fail within a certain time period, and, if it is determined that the at least one storage device has failed or is likely to fail within a certain time period, such that data in a data set has become faulty or is likely to become faulty; and
   to analyse at least some of the remaining fault-free data in the data set and to reassess its classification according to its importance in rendering the data set usable from the fault-free data alone; and
   to cause the manner in which the data is stored to be maintained or changed dependent upon the classification of the data in the data set in providing a usable data set.

31. Apparatus according to claim 30, wherein the data storage manager is arranged so that the manner in which the data is stored is changed by increasing protection that is applied to at least some of the stored data.

32. Apparatus according to claim 30, wherein the data storage manager is arranged so that the manner in which the data is stored is changed by increasing error protection that is applied to at least some of the stored data.

33. A method of managing storage of data comprising at least one data set, the method comprising:
   classifying data within a data set according to its importance in rendering the data set usable;
   storing the data according to the importance of the data in the data set; and
   checking the stored data for development of a fault in the stored data;
   wherein, after a fault is detected in a data set, the data set comprises faulty data and fault-free data and the method further comprises:
   analysing at least some of the remaining fault-free data in the data set and reassessing its classification according to its importance in providing a usable data set from the fault-free data alone; and
   determining, based upon said classification, whether measures are required to maintain a usable data set and, if so, applying, in dependence upon the classification of the remaining fault-free data in the data set, to at least some of the remaining fault-free data in the data set at least one of: (i) protection or increased protection and (ii) error correction or increased error correction.

34. A method according to claim 33, wherein data that is classed as being of relatively low importance is stored with a relatively low level of protection or no protection, and data that is classed as being of relatively high importance is stored with a relatively high level of protection.

35. A method according to claim 33, wherein data that is classed as being of relatively low importance is stored with a relatively low level of error correction or no error correction, and data that is classed as being of relatively high importance is stored with a relatively high level of error correction.

36. An apparatus for managing storage of data comprising at least one data set, the apparatus comprising:
   a classifier arranged to classify data within a data set according to its importance in rendering the data set usable;
   a data storage manager arranged:
   to store the data according to the importance of the data in the data set; and
   to check the stored data for development of a fault in the stored data, wherein, after a fault is detected in a data set, the data set comprises faulty data and fault-free data, the classifier being arranged to analyse at least some of the remaining fault-free data and reassess its classification according to its importance in providing a usable data set from the remaining fault-free data alone after a fault has been detected and the data storage manager being further arranged to determine, based upon said classification, whether measures are required to maintain a usable data set and, if so, to cause application, in dependence upon the classification of the remaining fault-free data in the data set, to at least some of the remaining fault-free data at least one of: (i) increased protection and (ii) increased error correction.

37. Apparatus according to claim 36, wherein the data storage manager is arranged so that data that is classed as being of relatively low importance is stored with a relatively low level of protection or no protection, and data that is classed as being of relatively high importance is stored with a relatively high level of protection.

38. Apparatus according to claim 36, wherein the data storage manager is arranged so that data that is classed as being of relatively low importance is stored with a relatively low level of error correction or no error correction, and data that is classed as being of relatively high importance is stored with a relatively high level of error correction.

* * * * *